United States Patent
Ahn et al.

(10) Patent No.: US 11,581,367 B2
(45) Date of Patent: Feb. 14, 2023

(54) SEMICONDUCTOR DEVICE

(71) Applicant: Samsung Electronics Co., Ltd., Suwon-si (KR)

(72) Inventors: Dongho Ahn, Hwaseong-si (KR); Segab Kwon, Seoul (KR); Chungman Kim, Suwon-si (KR); Kwangmin Park, Seoul (KR); Zhe Wu, Seoul (KR); Seunggeun Yu, Seoul (KR); Wonjun Lee, Seoul (KR); Jabin Lee, Hwaseong-si (KR); Jinwoo Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 31 days.

(21) Appl. No.: 17/209,660

(22) Filed: Mar. 23, 2021

(65) Prior Publication Data
US 2022/0069011 A1    Mar. 3, 2022

(30) Foreign Application Priority Data

Aug. 27, 2020 (KR) .......................... 10-2020-0108672

(51) Int. Cl.
*H01L 27/24* (2006.01)
*H01L 45/00* (2006.01)

(52) U.S. Cl.
CPC ...... *H01L 27/2427* (2013.01); *H01L 27/2481* (2013.01); *H01L 45/06* (2013.01); *H01L 45/1233* (2013.01); *H01L 45/1253* (2013.01); *H01L 45/1675* (2013.01)

(58) Field of Classification Search
CPC .................................................. H01L 27/2427
See application file for complete search history.

(56) References Cited

U.S. PATENT DOCUMENTS

| | | |
|---|---|---|
| 9,123,890 B2 | 9/2015 | Matamis et al. |
| 9,640,588 B2 | 5/2017 | Sciarrillo et al. |
| 10,424,619 B2 | 9/2019 | Park |
| 2018/0040669 A1 | 2/2018 | Wu et al. |
| 2020/0091234 A1 | 3/2020 | Lee et al. |
| 2020/0106013 A1 | 4/2020 | Strutt et al. |
| 2020/0144496 A1 | 5/2020 | Glassman et al. |
| 2020/0235162 A1* | 7/2020 | Majhi ..................... H01L 43/12 |

* cited by examiner

*Primary Examiner* — Mounir S Amer
(74) *Attorney, Agent, or Firm* — Harness, Dickey & Pierce, P.L.C.

(57) ABSTRACT

A semiconductor device includes a semiconductor substrate, a peripheral device on the semiconductor substrate, a lower insulating structure on the semiconductor substrate and covering the peripheral device, a first conductive line on the lower insulating structure, a memory cell structure on the first conductive line, and a second conductive line on the memory cell structure. The memory cell structure may include an information storage material pattern and a selector material pattern on the lower insulating structure in a vertical direction. The selector material pattern may include a first selector material layer including a first material and a second selector material layer including a second material. The second selector material layer may have a threshold voltage drift higher than that of the first material. The second selector material layer may have a second width narrower than a first width of the first selector material layer.

20 Claims, 18 Drawing Sheets

SEMICONDUCTOR DEVICE

CROSS-REFERENCE TO RELATED APPLICATION(S)

This application claims the benefit under 35 USC 119(a) of Korean Patent Application No. 10-2020-0108672 filed on Aug. 27, 2020 in the Korean Intellectual Property Office, the entire disclosure of which is incorporated herein by reference for all purposes.

BACKGROUND

The present inventive concept relates to a semiconductor device, and more particularly, to a semiconductor device including a selector material pattern.

In accordance with the trend for performance improvements and low power consumption of semiconductor devices such as memory devices, next-generation memory devices such as a phase-change random access memory (PRAM) and a resistive random access memory (RRAM) have been developed. Such next-generation memory devices have been formed using an information storage material whose resistance value may be changed according to a current or a voltage and may be maintained as is, even in the case that the supply of the current or the voltage is stopped.

SUMMARY

Example embodiments provide a semiconductor device including a selector material pattern having a multilayer structure.

According to some example embodiments, a semiconductor device may include a semiconductor substrate, a peripheral device on the semiconductor substrate, a lower insulating structure on the semiconductor substrate and covering the peripheral device, a first conductive line on the lower insulating structure, a memory cell structure on the first conductive line, and a second conductive line on the memory cell structure. The memory cell structure may include an information storage material pattern and a selector material pattern on the lower insulating structure in a vertical direction. The selector material pattern may include a first selector material layer having a first width and a second selector material layer having a second width narrower than the first width. The first selector material layer may include a first material and the second selector material layer may include a second material. The second selector material layer may have a threshold voltage drift higher than a threshold voltage drift of the first material.

According to some example embodiments, a semiconductor device may include a first conductive line on a semiconductor substrate, a second conductive line on the first conductive line, a third conductive line on the second conductive line, and a plurality of memory cell structures on the semiconductor substrate. The plurality of memory cell structures may include a first memory cell structure and a second memory cell structure. The first memory cell structure may be between the first conductive line and the second conductive line and the first memory cell structure may include a first selector material pattern, a first information storage material pattern, and first electrode patterns overlapping each other in a vertical direction. The second memory cell structure may be between the second conductive line and the third conductive line and the second memory cell structure may include a second selector material pattern, a second information storage material pattern, and second electrode patterns overlapping each other in the vertical direction. Each of the first selector material pattern and the second selector material patterns may include a first selector material layer having a first width and a second selector material layer having a second width narrower than the first width.

According to some example embodiments, a semiconductor device may include a first conductive line, a second conductive line above the first conductive line, and a memory cell structure between the first conductive line and the second conductive line. The memory cell structure may include an information storage material pattern and a selector material pattern connected to each other in series in a vertical direction. The selector material pattern may include a first selector material layer having a first thickness and a second selector material layer having a second thickness. The first selector material layer may include a first material. The second selector material layer may include a second material having a threshold voltage drift higher than a threshold voltage drift of the first material.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, example embodiments of the present disclosure will be described with reference to the accompanying drawings.

Figure 1:
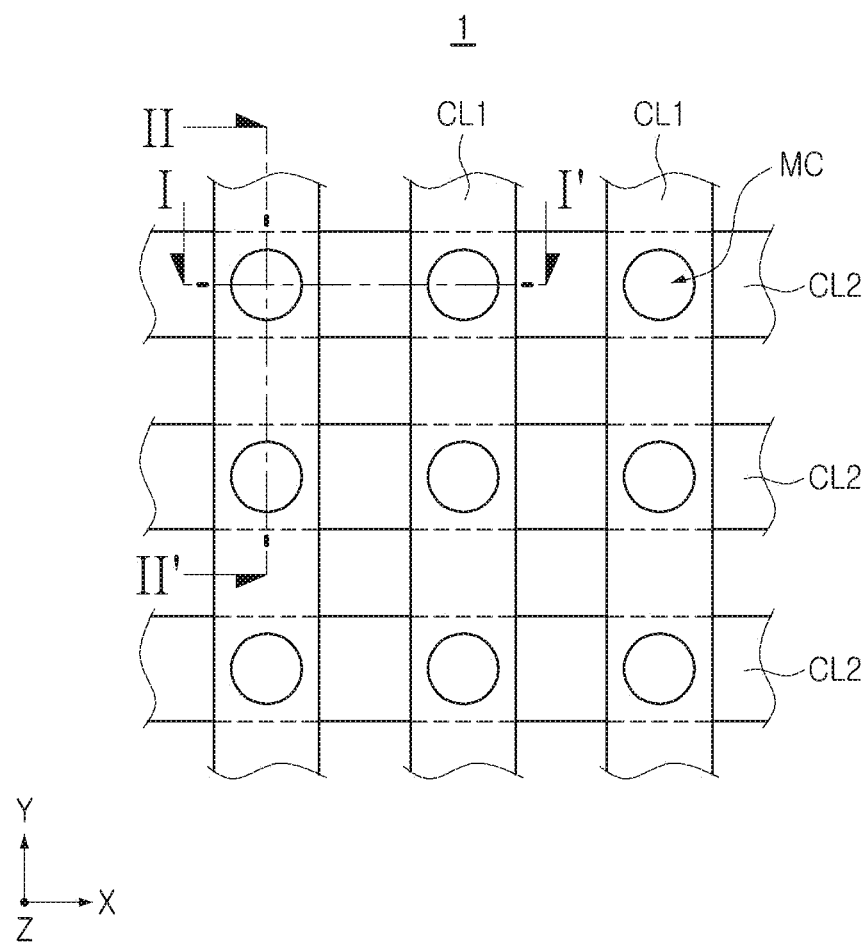
FIG. 1 is a schematic plan view of a semiconductor device according to example embodiments.

FIG. 1 is a schematic plan view of a semiconductor device according to example embodiments.

Figure 2:
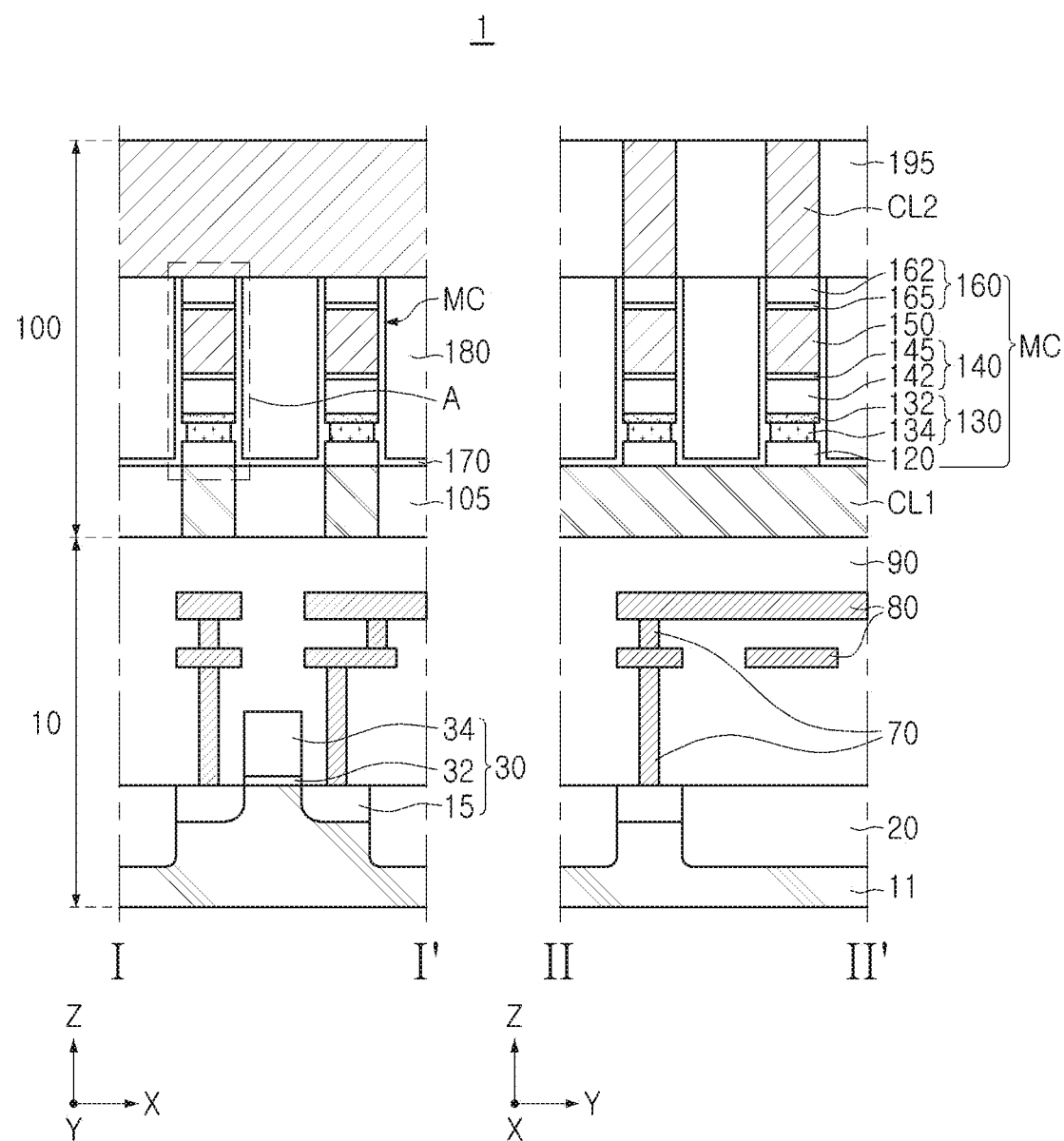
FIG. 2 is a schematic cross-sectional view of the semiconductor device according to example embodiments.

FIG. 2 is a schematic cross-sectional view of the semiconductor device according to example embodiments. FIG. 2 is a cross-sectional view illustrating a region taken along line I-I' and a region taken along line II-II' of FIG. 1.

Figure 3:
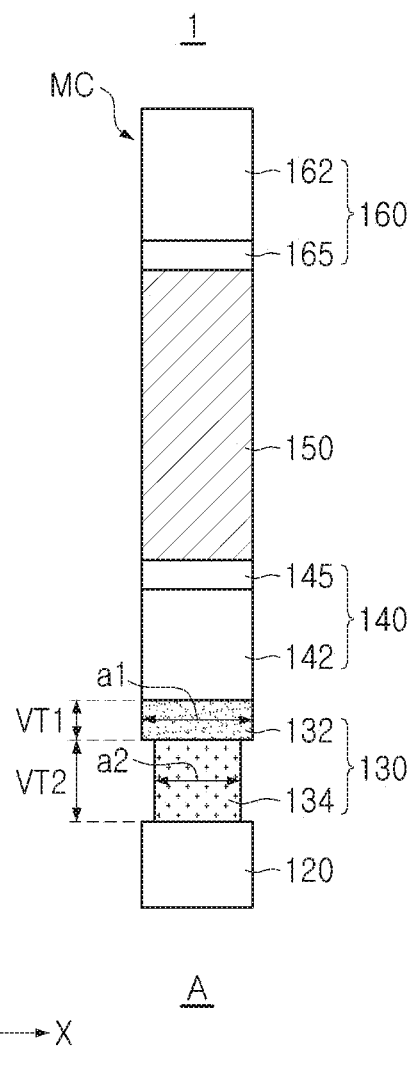
FIG. 3 is a partially enlarged view of the semiconductor device according to example embodiments.

FIG. 3 is a partially enlarged view of the semiconductor device according to example embodiments. FIG. 3 is an enlarged view of region 'A' of FIG. 2.

Referring to FIGS. 1 to 3, a semiconductor device 1 may include a cell stack structure 100 on a peripheral circuit region 10.

The peripheral circuit region 10 may include a semiconductor substrate 11 and peripheral devices 30, a lower insulating structure 90, and wiring structures 70 and 80 that are disposed on the semiconductor substrate 11.

The semiconductor substrate 11 may have an upper surface extending in an x direction and a y direction. A device isolation layer 20 defining an active region may be disposed on the semiconductor substrate 11. Source/drain regions 15 including impurities may be disposed in a part of the active region. The semiconductor substrate 11 may include a semiconductor material, for example, a group IV semiconductor, a group III-V compound semiconductor, or a group II-VI compound semiconductor.

The peripheral devices 30 may include a transistor. Each of the peripheral devices 30 may include source/drain regions 15, a circuit gate dielectric layer 32, and a circuit gate electrode 34. The source/drain regions 15 may be disposed in the active region of the semiconductor substrate 11 on both sides of the circuit gate electrode 34.

The lower insulating structure 90 may be disposed on the peripheral device 30 on the semiconductor substrate 11.

The wiring structures 70 and 80 may include vertical wirings 70 and horizontal wirings 80. The vertical wirings 70 and the horizontal wirings 80 may penetrate through the lower insulating structure 90 and may be electrically connected to the peripheral device 30. The horizontal wirings 80 may be connected to the vertical wirings 70 and may be disposed as a plurality of layers.

The cell stack structure 100 may include a first conductive line CL1, a second conductive line CL2, and a memory cell structure MC, a sidewall spacer 170, and an interlayer insulating layer 180 that are disposed between the first conductive line CL1 and the second conductive line CL2.

The first conductive line CL1 may be disposed on the peripheral circuit region 10. The first conductive lines CL1 may extend in a second direction (for example, a Y direction) on the lower insulating structure 90, and may be disposed to be spaced apart from each other in a first direction (for example, an X direction) intersecting with the second direction (for example, the Y direction). The second conductive lines CL2 may extend in the first direction (for example, the X direction) intersecting with the second direction (for example, the Y direction) above the first conductive lines CL1, and may be disposed to be spaced apart from each other in the second direction.

In an example embodiment, one of the first conductive line CL1 and the second conductive line CL2 may be a word line, and the other of the first conductive line CL1 and the second conductive line CL2 may be a bit line.

First gap-fill patterns 105 may be disposed between the first conductive lines CL1. For example, the first gap-fill patterns 105 may include at least one of SiN, SiON, SiC, SiCN, SiOC, SiOCN, $SiO_2$, and $Al_2O_3$. The first gap-fill patterns 105 may be formed by processes such as chemical vapor deposition (CVD), physical vapor deposition (PVD), atomic layer deposition (ALD), and silicon-on-glass (SOG).

The interlayer insulating layer 180 filling a space between the memory cell structures MC may be disposed on the first gap-fill patterns 105 and the first conductive lines CL1. For example, the interlayer insulating layer 180 may include at least one of SiN, SiON, SiC, SiCN, SiOC, SiOCN, $SiO_2$, and $Al_2O_3$. The interlayer insulating layer 180 may be formed by processes such as CVD, PVD, ALD, and SOG.

Similarly, second gap-fill patterns 195 may be disposed between the second conductive lines CL2. For example, the second gap-fill patterns 195 include an insulating material, similar to the first gap-fill patterns 105, and may be formed by processes similar to the processes of forming the first gap-fill patterns 105.

In some example embodiments, at least one of the first and second gap-fill patterns 105 and 195 and the interlayer insulating layer 180 may have a multilayer structure including two or more layers having different compositions.

As illustrated in FIG. 1, the memory cell structures MC may be disposed in intersection regions between first and second conductive lines CL1 and CL2, respectively.

The memory cell structure MC may include a selector material pattern 130, an information storage material pattern 150, and electrode patterns 120, 140, and 160 overlapping each other in a vertical direction (for example, a Z direction). The memory cell structure MC may be disposed in a third direction (for example, the Z direction), which is the vertical direction, on the lower insulating structure 90. The selector material pattern 130 and the information storage material pattern 150 may be disposed in the third direction (for example, the Z direction), which is perpendicular to an upper surface of the semiconductor substrate 11, on the first conductive line CL1 and the second conductive line CL2 (particularly, the intersection regions).

The information storage material pattern 150 may include a phase change memory material whose phase may change from a crystalline phase to an amorphous phase or change from an amorphous phase to a crystalline phase at the time of an operation of the semiconductor device. For example, the information storage material pattern 150 may include a phase change material such as a chalcogenide-based material including Ge, Sb, and/or Te. In another example embodiment, the information storage material pattern 150 may include a variable resistance material capable of storing information in a different manner from the phase change material, instead of the phase change material.

In an example embodiment, the information storage material pattern 150 may include at least one of a binary composition such as GeTe, GeSe, GeS, SbSe, SbTe, SbS, SbSe, SnSb, InSe, InSb, AsTe, AlTe, GaSb, AlSb, BiSb, ScSb, Ysb, CeSb, DySb, and NdSb, a ternary composition such as GeSbSe, AlSbTe, AlSbSe, SiSbSe, SiSbTe, GeSeTe, InGeTe, GeSbTe, GeAsTe, SnSeTe, GeGaSe, BiSbSe, GaSeTe, InGeSb, GaSbSe, GaSbTe, InSbSe, InSbTe, SnSbSe, SnSbTe, ScSbTe, ScSbSe, ScSbS, YSbTe, YSbSe, YSbS, CeSbTe, CeSbSe, CeSbS, DySbTe, DySbSe, DySbS, NdSbTe, NdSbSe, and NdSbS, a quaternary composition such as GeSbTeS, BiSbTeSe, AgInSbTe, GeSbSeTe, GeSnSbTe, SiGeSbTe, SiGeSbSe, SiGeSeTe, BiGeSeTe, BiSiGeSe, BiSiGeTe, GeSbTeBi, GeSbSeBi, GeSbSeIn, GeSbSeGa, GeSbSeAl, GeSbSeTl, GeSbSeSn, GeSbSeZn, GeSbTeIn, GeSbTeGa, GeSbTeAl, GeSbTeTl, GeSbTeSn, GeSbTeZn, ScGeSbTe, ScGeSbSe, ScGeSbS, YGeSbTe, YGeSbSe, YGeSbS, CeGeSbTe, CeGeSbSe, CeGeSbS, DyGeSbTe, DyGeSbSe, DyGeSbS, NdGeSbTe, NdGeSbSe, and NdGeSbS, and a quintary composition such as InSbTe-AsSe, GeScSbSeTe, GeSbSeTeS, GeScSbSeS, GeScSbTeS, GeScSeTeS, GeScSbSeP, GeScSbTeP, GeSbSeTeP, GeScSbSeIn, GeScSbSeGa, GeScSbSeAl, GeScSbSeTl, GeScSbSeZn, GeScSbSeSn, GeScSbTeIn, GeScSbTeGa, GeSbAsTeAl, GeScSbTeTl, GeScSbTeZn, GeScSbTeSn, GeSbSeTeIn, GeSbSeTeGa, GeSbSeTeAl, GeSbSeTeTl, GeSbSeTeZn, GeSbSeTeSn, GeSbSeSIn, GeSbSeSGa, GeSbSeSAl, GeSbSeSTl, GeSbSeSZn, GeSbSeSSn, GeSbTeSIn, GeSbTeSGa, GeSbTeSAl, GeSbTeSTl, GeSbTeSZn, GeSbTeSSn, GeSbSeInGa, GeSbSeInAl, GeSbSeInTl, GeSbSeInZn, GeSbSeInSn, GeSbSeGaAl, GeSbSeGaTl, GeSbSeGaZn, GeSbSeGaSn, GeSbSeAlTl, GeSbSeAlZn, GeSbSeAlSn, GeSbSeTlZn, GeSbSeTlSn, and GeSbSeZnSn. In some example embodiments, the compositions may contain at least one element of B, C, N, O, P, Cd, W, Ti, Hf, and Zr in a trace amount. In some example embodiments, the information storage material pattern 150 may have a multilayer structure including two or more layers having different compositions.

The memory cell stacking structure 100 employed in the present example embodiment is illustrated as a single-stage structure, but is not limited thereto, and may have a two-stack structure or other multiple-stack structure (for example, a four-stack structure).

The selector material pattern 130 may have a multilayer structure including two or more layers having different compositions. The selector material pattern 130 may include a first selector material layer 132 and a second selector material layer 134.

The first selector material layer 132 may be disposed on the second selector material layer 134. The first selector material layer 132 may be disposed on a higher level than the second selector material layer 134. The first selector material layer 132 may be disposed between an intermediate electrode pattern 140 and the second selector material layer 134. The first selector material layer 132 may be in contact with the intermediate electrode pattern 140. The second selector material layer 134 may be disposed on a lower electrode pattern 120. The second selector material layer 134 may be in contact with the lower electrode pattern 120.

The first selector material layer 132 may have a first width a1 in the first direction (for example, the X direction). The second selector material layer 134 may have a second width a2 smaller than the first width a1 in the first direction (for example, the X direction). In an example embodiment, the selector material pattern 130 may be symmetrical with respect to a central axis between both side surfaces of the selector material pattern 130. In an example embodiment, each of the first selector material layer 132 and the second selector material layer 134 may be symmetrical with respect to the same central axis. In an example embodiment, the selector material pattern 130 may have a 'T' shape.

The first selector material layer 132 may have a first thickness VT1 in the third direction (for example, the Z direction), and the second selector material layer 134 may have a second thickness VT2 greater than the first thickness VT1 in the third direction (for example, the Z direction). In an example embodiment, the second selector material layer 134 may have a width narrower than that of the first selector material layer 132 and may have a vertical thickness greater than that of the first selector material layer 132.

The selector material pattern 130 may include a material having switching device characteristics. For example, the selector material pattern 130 may include an Ovonic threshold switching device (OTS). In an example embodiment, the selector material pattern 130 may include a chalcogenide-based material different from the chalcogenide-based material of the information storage material pattern 150. For example, the selector material pattern 130 may include a chalcogenide-based Ovonic threshold switch material that may be maintained in an amorphous phase at the time of an operation of the semiconductor device. For example, the selector material pattern 130 may include alloy materials containing two or more of an As element, an S element, a Se element, a Te element, or a Ge element, or an additional element (for example, a Si element or an N element) capable of maintaining an amorphous phase in these alloy materials at a higher temperature.

In an example embodiment, each of the first selector material layer 132 and the second selector material layer 134 of the selector material pattern 130 include at least one of a binary composition such as GeSe, GeS, AsSe, AsTe, AsS SiTe, SiSe, SiS, GeAs, SiAs, SnSe, and SnTe, a ternary composition such as GeAsTe, GeAsSe, AlAsTe, AlAsSe, SiAsSe, SiAsTe, GeSeTe, GeSeSb, GaAsSe, GaAsTe, InAsSe, InAsTe, SnAsSe, and SnAsTe, a quaternary composition such as GeSiAsTe, GeSiAsSe, GeSiSeTe, GeSeTeSb, GeSiSeSb, GeSiTeSb, GeSeTeBi, GeSiSeBi, GeSiTeBi, GeAsSeSb, GeAsTeSb, GeAsTeBi, GeAsSeBi, GeAsSeIn, GeAsSeGa, GeAsSeAl, GeAsSeTl, GeAsSeSn, GeAsSeZn, GeAsTeIn, GeAsTeGa, GeAsTeAl, GeAsTeTl, GeAsTeSn, and GeAsTeZn, a quintary composition such as GeSiAsSeTe, GeAsSeTeS, GeSiAsSeS, GeSiAsTeS, GeSiSeTeS, GeSiAsSeP, GeSiAsTeP, GeAsSeTeP, GeSiAsSeIn, GeSiAsSeGa, GeSiAsSeAl, GeSiAsSeTl, GeSiAsSeZn, GeSiAsSeSn, GeSiAsTeIn, GeSiAsTeGa, GeSiAsTeAl, GeSiAsTeTl, GeSiAsTeZn, GeSiAsTeSn, GeAsSeTeIn, GeAsSeTeGa, GeAsSeTeAl, GeAsSeTeTl, GeAsSeTeZn, GeAsSeTeSn, GeAsSeSIn, GeAsSeSGa, GeAsSeSAl, GeAsSeSTl, GeAsSeSZn, GeAsSeSSn, GeAsTeSIn, GeAsTeSGa, GeAsTeSAl, GeAsTeSTl, GeAsTeSZn, GeAsTeSSn, GeAsSeInGa, GeAsSeInAl, GeAsSeInTl, GeAsSeInZn, GeAsSeInSn, GeAsSeGaAl, GeAsSeGaTl, GeAsSeGaZn, GeAsSeGaSn, GeAsSeAlTl, GeAsSeAlZn, GeAsSEAlSn, GeAsSeTlZn, GeAsSeTlSn, and GeAsSeZnSn, and a senary composition such as GeSiAsSeTeS, GeSiAsSeTeIn, GeSiAsSeTeGa, GeSiAsSeTeAl, GeSiAsSeTeTl, GeSiAsSeTeZn, GeSiAsSeTeSn, GeSiAsSeTeP, GeSiAsSeIn, GeSiAsSeGa, GeSiAsSeAl, GeSiAsSeSTl, GeSiAsSeSZn, GeSiAsSeSSn, GeAsSeTeSIn, GeAsSeTeSGa, GeAsSeTeSAl, GeAsSeTeSTl, GeAsSeTeSZn, GeAsSeTeSSn, GeAsSeTePIn, GeAsSeTePGa, GeAsSeTePAl, GeAsSeTePTl, GeAsSeTePZn, GeAsSeTePSn, GeSiAsSeInGa, GeSiAsSeInAl, GeSiAsSeInTl, GeSiAsSeInZn, GeSiAsSeInSn, GeSiAsSeGaAl, GeSiAsSeGaTl, GeSiAsSeGaZn, GeSiAsSeGaSn, GeSiAsSeAlSn, GeAsSeTeInGa, GeAsSeTeInAl, GeAsSeTeInTl, GeAsSeTeInZn, GeAsSeTeInSn, GeAsSeTeGaAl, GeAsSeTeGaTl, GeAsSeTeGaZn, GeAsSeTeGaSn, GeAsSeTeAlSn, GeAsSeSInGa, GeAsSeSInAl, GeAsSeSInTl, GeAsSeSInZn, GeAsSeSInSn, GeAsSeSGaAl, GeAsSeSGaTl, GeAsSeSGaZn, GeAsSeSGaSn, and GeAsSeSAlSn. In some example embodiments, these compositions may contain at least one element of B, C, N, and O in a trace amount.

The electrode patterns 120, 140, and 160 may include the lower electrode pattern 120 disposed between the first conductive line CL1 and the selector material pattern 130, the intermediate electrode pattern 140 disposed between the selector material pattern 130 and the information storage material pattern 150, and an upper electrode pattern 160 disposed between the information storage material pattern 150 and the second conductive line CL2.

The lower electrode pattern 120 may be disposed on the first conductive line CL1. The lower electrode pattern 120 may be disposed beneath the selector material pattern 130. The lower electrode pattern 120 may be in contact with the second selector material layer 134 of the selector material pattern 130. The lower electrode pattern 120 may include a carbon-containing material. The carbon-containing material may be a carbon element material or a conductive material containing a carbon element and a metal element (for example, W, Ti, Ta, or Co). For example, such a carbon and metal containing material may include a metal-carbon alloy material such as tungsten carbide (WC) or titanium carbide (TiC). Hereinafter, the "carbon-containing material" may be understood to include not only the carbon element material but also the conductive material containing carbon and metal as described above.

The intermediate electrode pattern 140 may include a first intermediate electrode layer 142 disposed on the selector material pattern 130 and a second intermediate electrode layer 145 disposed on the first intermediate electrode layer 142. The intermediate electrode pattern 140 may be in contact with the first selector material layer 132 of the selector material pattern 130. The first intermediate electrode layer 142 may be disposed between the selector material pattern 130 and the second intermediate electrode layer 145. The first intermediate electrode layer 142 may be in contact with the selector material pattern 130. The first intermediate electrode layer 142 may be in contact with the first selector material layer 132. The second intermediate electrode layer 145 may be in contact with a lower surface of the information storage material pattern 150. The first intermediate electrode layer 142 may have a thickness greater than that of the second intermediate electrode layer 145. In an example embodiment, the first intermediate electrode layer 142 may include a carbon-containing material. In an example embodiment, the second intermediate electrode layer 145 may include tungsten or a tungsten compound.

The upper electrode pattern 160 may be disposed on the information storage material pattern 150. The upper electrode pattern 160 may include a first upper electrode layer 165 disposed on the information storage material pattern 150 and a second upper electrode layer 162 disposed on the first upper electrode layer 165. The first upper electrode layer 165 may be disposed between the information storage material pattern 150 and the second upper electrode layer 162. The first upper electrode layer 165 may be in contact with an upper surface of the information storage material pattern 150. The second upper electrode layer 162 may have a thickness greater than that of the first upper electrode layer 165. In an example embodiment, the first upper electrode layer 165 may include tungsten or a tungsten compound. In an example embodiment, the second upper electrode layer 162 may include a carbon-containing material.

The information storage material pattern 150 may include a phase change material layer that may change from a crystalline phase to an amorphous phase or change from an amorphous phase to a crystalline phase in order to store data or erase stored data. For example, the information storage material pattern 150 may have a relatively low resistance value in a case where it is in the crystalline phase, and may have a relatively high resistance value in a case where it is in the amorphous phase. As described above, the semiconductor device 1 may perform a program operation of distinguishing between a case where the resistance value of the information storage material pattern 150 is low and a case where the resistance value is high and programming these cases as data "0" and "1", respectively, a read operation of reading the data "0" and "1" programmed as described above, and an erase operation of erasing the data of the information storage material pattern 150.

At the time of a program operation of allowing a program current to flow in order to write data to the information storage material pattern 150, a read operation of allowing a read current to flow in order to determine the data of the information storage material pattern 150, and an erase operation of allowing an erase current to flow in order to erase the data of the information storage material pattern 150, the selector material pattern 130 may be maintained in an amorphous phase.

In a case where a current flows through the selector material pattern 130 for an operation of the semiconductor device 1, a leakage current or a threshold voltage drift phenomenon over time may occur in the selector material pattern 130. In order to limit and/or prevent a read error of the data stored in the information storage material pattern 150 from occurring due to the leakage current or the threshold voltage drift phenomenon over time in the selector material pattern 130, the selector material pattern 130 may include a plurality of different selector material layers.

In an example embodiment, the first selector material layer 132 may be disposed in a direction in which a current starts to flow in the selector material pattern 130, and the second selector material layer 134 may be disposed in a direction in which the current flows out from the selector material pattern 130. For example, in a case where the current flows from the intermediate electrode pattern 140 in contact with an upper surface of the selector material pattern 130 to the lower electrode pattern 120 in contact with a lower surface of the selector material pattern 130, the first selector material layer 132 may be disposed on the second selector material layer 134.

For example, in a case where the current flows from the first selector material layer 132 to the second selector material layer 134, the first selector material layer 132 may include a first material having a leakage current value greater than that of the second selector material layer 134, and the second selector material layer 134 may include a second material having a leakage current value smaller than that of the first selector material layer 132. As described above, the second selector material layer 134 may be formed of the second material having relatively small leakage current characteristics, such that electrical characteristics of the selector material pattern 130 may be improved.

According to an example embodiment, in the case where the current flows from the first selector material layer 132 to the second selector material layer 134, the first selector material layer 132 may include a first material having a threshold voltage drift relatively smaller than that of the second selector material layer 134, and the second selector material layer 134 may include a second material having a threshold voltage drift relatively greater than that of the first selector material layer 132. The first material may have a threshold voltage drift smaller than that of the second material. The threshold voltage drift may be referred to as a change width in a threshold voltage over time. That is, in the case where the current flows from the first selector material layer 132 to the second selector material layer 134, the first selector material layer 132 may include a material having a threshold voltage drift smaller than that of a material included in the second selector material layer 134. As described above, the first selector material layer 132 may be formed of the first material having relatively low threshold voltage drift, such that electrical characteristics of the selector material pattern 130 may be improved.

In an example embodiment, in order to improve electrical characteristics of the semiconductor device 1, the first selector material layer 132 may include a material having a leakage current value greater than that of a material of the second selector material layer 134 and a threshold voltage drift smaller than that of the material of the second selector material layer 134. In addition, the second selector material layer 134 may include a material having a leakage current value smaller than that of the material of the first selector material layer 132 and having a threshold voltage drift higher than that of the material of the first selector material layer 132.

In an example embodiment, when the current flows from the first selector material layer 132 to the second selector material layer 134, the threshold voltage drift of the first selector material layer 132 may be relatively smaller in a case where the first width a1 of the first selector material layer 132 is greater than the second width a2 of the second selector material layer 134 than in a case where the first width a1 and the second width a2 are substantially the same as each other. In an example embodiment, the first width a1 of the first selector material layer 132 and the second width a2 of the second selector material layer 134 may be different from each other regardless of a direction of the current.

In an example embodiment, when the current flows from the first selector material layer 132 to the second selector material layer 134, the leakage current value of the second selector material layer 134 may be smaller in a case where the second thickness VT2 of the second selector material layer 134 is greater than the first thickness VT1 of the first selector material layer 132 than in a case where the first thickness VT1 and the second thickness VT2 are substantially the same as each other. In an example embodiment, the first thickness VT1 of the first selector material layer 132 and the second thickness VT2 of the second selector material layer 134 may be different from each other regardless of the direction of the current.

The sidewall spacers 170 may be disposed on side surfaces of the memory cell structures MC. The sidewall spacers 170 may be disposed between the interlayer insulating layer 180 and the memory cell structures MC. In an example embodiment, the sidewall spacers 170 may extend between a lower surface of the interlayer insulating layer 180, and the first conductive lines CL1 and the first gap-fill patterns 105. A thickness of the sidewall spacer 170 disposed on a side surface of the selector material pattern 130 may be greater than that of the sidewall spacer 170 disposed on side surfaces of the electrode patterns 120 and 140 adjacent to the selector material pattern 130. A thickness of the sidewall spacer 170 disposed on a side surface of the second selector material layer 134 may be greater than that of the sidewall spacer 170 disposed on a side surface of the first selector material layer 132.

Figure 4:
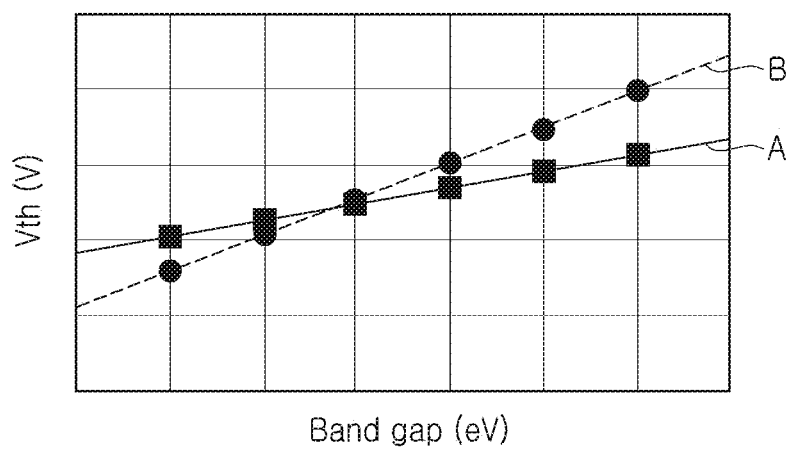
FIG. 4 is graphs illustrating threshold voltage drifts according to materials of the semiconductor device.

FIG. 4 is graphs illustrating threshold voltage drifts according to materials of the semiconductor device.

The first material A may be a material whose threshold voltage drift according to a change in band gap energy over time is smaller than that of the second material B. In an example embodiment, as described above with reference to FIGS. 1 to 3, when the current flows from the first selector material layer 132 to the second selector material layer 134, the first selector material layer 132 may include the first material A having the threshold voltage drift relatively smaller than that of the second selector material layer 134, and the second selector material layer 134 may include the second material B having a threshold voltage drift relatively greater than that of the first selector material layer 132. In an example embodiment, the leakage current value of the second material B may be smaller than that of the first material A.

Figure 5:
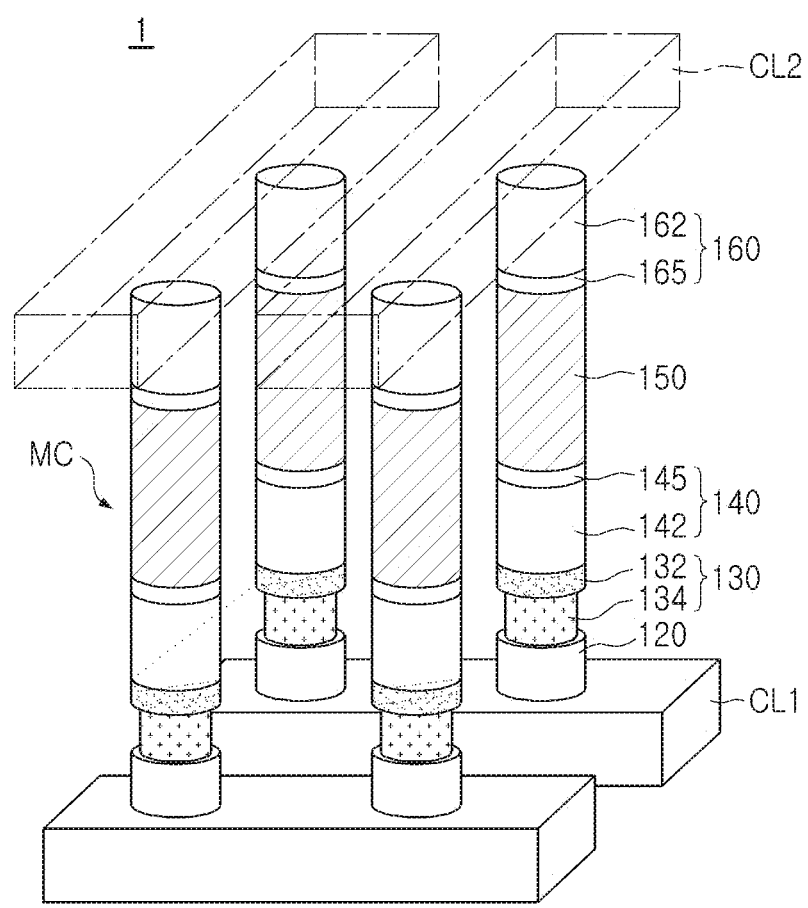
FIG. 5 is a perspective view of the semiconductor device according to example embodiments.

FIG. 5 is a perspective view of the semiconductor device according to example embodiments.

Referring to FIG. 5, the semiconductor device 1 may include the memory cell structure MC disposed between the first conductive line CL1 and the second conductive line CL2, and the memory cell structure MC may have a structure in which the information storage material pattern 150 is disposed on a higher level than the selector material pattern 130. The memory cell structure MC is illustrated in a cylindrical shape, but is not limited thereto. For example, the memory cell structure MC may include a plurality of patterns having a quadrangular shape such as a square shape or a rectangular shape or a circular shape in plan view.

Figure 6:
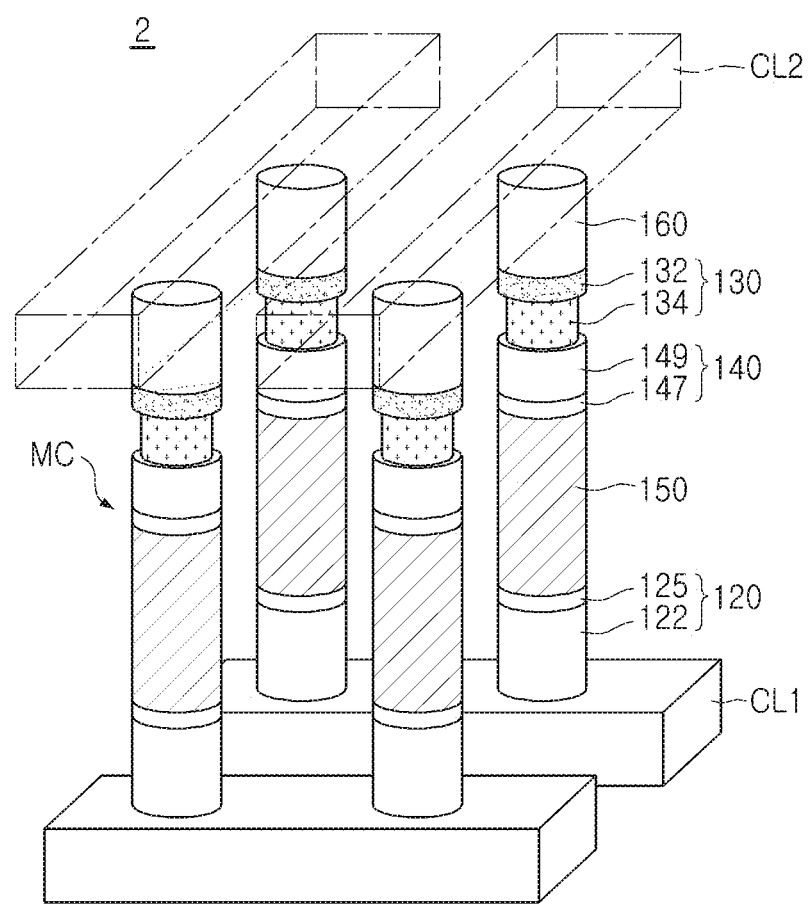
FIG. 6 is a perspective view of a semiconductor device according to example embodiments.

FIG. 6 is a perspective view of a semiconductor device according to example embodiments.

In FIG. 6, a description for the same components as those described with reference to FIGS. 1 to 3 will be omitted, and only modified components of the semiconductor device will be described.

Referring to FIG. 6, a semiconductor device 2 may include a memory cell structure MC disposed between the first conductive line CL1 and the second conductive line CL2, and the memory cell structure MC may have a structure in which a selector material pattern 130 is disposed on a higher level than an information storage material pattern 150.

The semiconductor device 2 may include a lower electrode pattern 120 disposed between the first conductive line CL1 and the information storage material pattern 150, an intermediate electrode pattern 140 disposed between the selector material pattern 130 and the information storage material pattern 150, and an upper electrode pattern 160 disposed between the selector material pattern 130 and the second conductive line CL2.

The lower electrode pattern 120 may be disposed on the first conductive line CL1. The lower electrode pattern 120 may include a first lower electrode layer 122 disposed on the first conductive line CL1 and a second lower electrode layer 125 disposed on the first lower electrode layer 122. The second lower electrode layer 125 may be in contact with the information storage material pattern 150. The first lower electrode layer 122 may have a thickness greater than that of the second lower electrode layer 125. In an example embodiment, the first lower electrode layer 122 may include a carbon-containing material. In an example embodiment, the second lower electrode layer 125 may include tungsten or a tungsten compound.

The intermediate electrode pattern 140 may be disposed on the information storage material pattern 150. The intermediate electrode pattern 140 may include a third intermediate electrode layer 147 disposed on the information storage material pattern 150 and a fourth intermediate electrode layer 149 disposed on the third intermediate electrode layer 147. The fourth intermediate electrode layer 149 may be in contact with the selector material pattern 130. The intermediate electrode pattern 140 may be in contact with a second selector material layer 134 of the selector material pattern 130. The fourth intermediate electrode layer 149 may be disposed between the selector material pattern 130 and the third intermediate electrode layer 147. The fourth intermediate electrode layer 149 may be in contact with the second selector material layer 134 of the selector material pattern 130. The third intermediate electrode layer 147 may be in contact with an upper surface of the information storage material pattern 150. The fourth intermediate electrode layer 149 may have a thickness greater than that of the third intermediate electrode layer 147. In an example embodiment, the third intermediate electrode layer 147 may include tungsten or a tungsten compound. In an example embodiment, the fourth intermediate electrode layer 149 may include a carbon-containing material.

The upper electrode pattern 160 may be disposed on the selector material pattern 130. The upper electrode pattern 160 may be disposed between the selector material pattern 130 and the second conductive line CL2. The upper electrode pattern 160 may be in contact with the selector material pattern 130. The upper electrode pattern 160 may be in contact with a first selector material layer 132. In an example embodiment, the upper electrode pattern 160 may include a carbon-containing material.

FIGS. 7 to 10 are partially enlarged views of semiconductor devices according to example embodiments. FIGS. 7 to 10 are enlarged views of a region corresponding to region 'A' of FIG. 2. In FIGS. 7 to 10, a description for the same components as those described with reference to FIGS. 1 to 3 will be omitted, and only modified components of the semiconductor device will be described.

Figure 7:
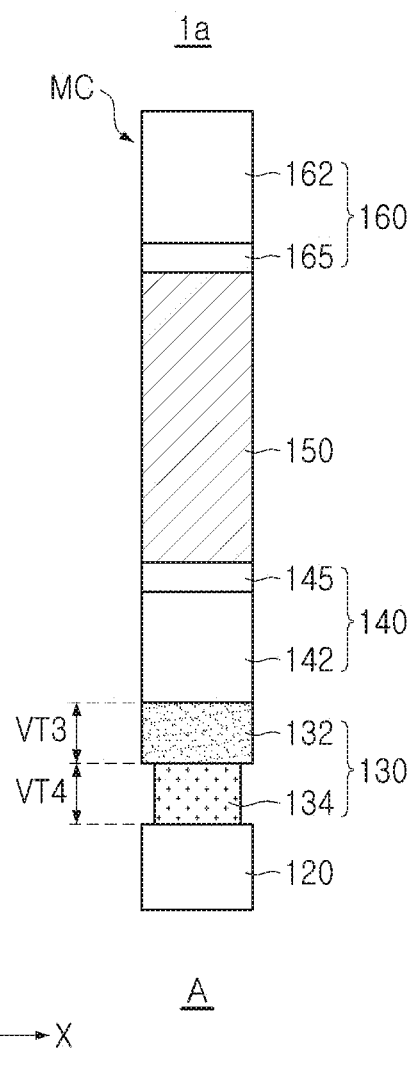
FIGS. 7 to 10 are partially enlarged views of semiconductor devices according to example embodiments.

Referring to FIG. 7, in a semiconductor device 1a, a selector material pattern 130 includes a first selector material layer 132 having a third thickness VT3 in the third direction (for example, the Z direction) and a second selector material layer 134 having a fourth thickness VT4 substantially the same as the third thickness VT3. The first selector material layer 132 and the second selector material layer 134 may have different widths in the first direction (for example, the X direction), and have substantially the same thickness in the third direction (for example, the Z direction).

Figure 8:
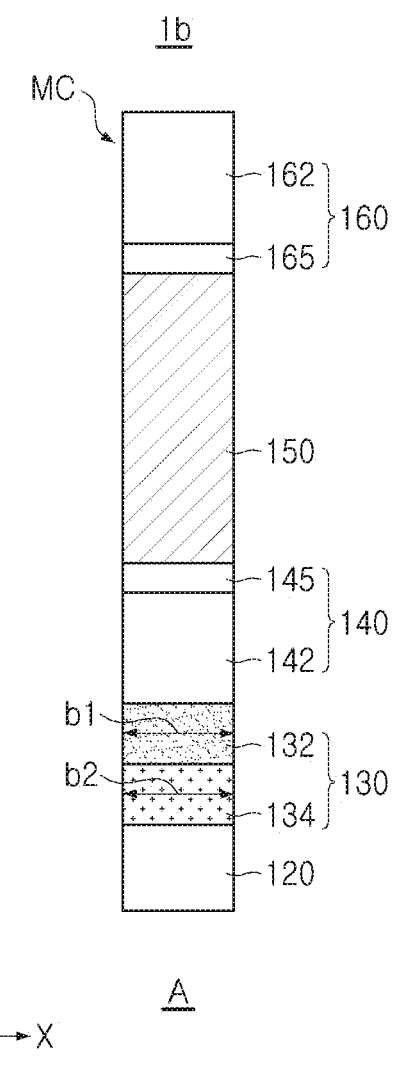

Referring to FIG. 8, in a semiconductor device 1b, a selector material pattern 130 includes a first selector material layer 132 having a third width b1 in the first direction (for example, the X direction) and a second selector material layer 134 having a fourth width b2 substantially the same as the third width b1. In an example embodiment, when a current flows from the first selector material layer 132 to the second selector material layer 134, widths of the first selector material layer 132 and the second selector material layer 134 may be the same as each other, the first selector material layer 132 may include a first material having a threshold voltage drift relatively smaller than that of the second selector material layer 134, and the second selector material layer 134 may include a second material having a threshold voltage drift higher than that of the first selector material layer 132. In an example embodiment, when a current flows from the first selector material layer 132 to the second selector material layer 134, widths of the first selector material layer 132 and the second selector material layer 134 may be the same as each other, the first selector material layer 132 may include a first material having a first leakage current value, and the second selector material layer 134 may include a second material having a second leakage current value smaller than the first leakage current value.

In an example embodiment, a vertical thickness of the first selector material layer 132 may be the same as that of the second selector material layer 134. In another example, a vertical thickness of the second selector material layer 134 may be greater than that of the first selector material layer 132 as illustrated in FIG. 2.

Figure 9:
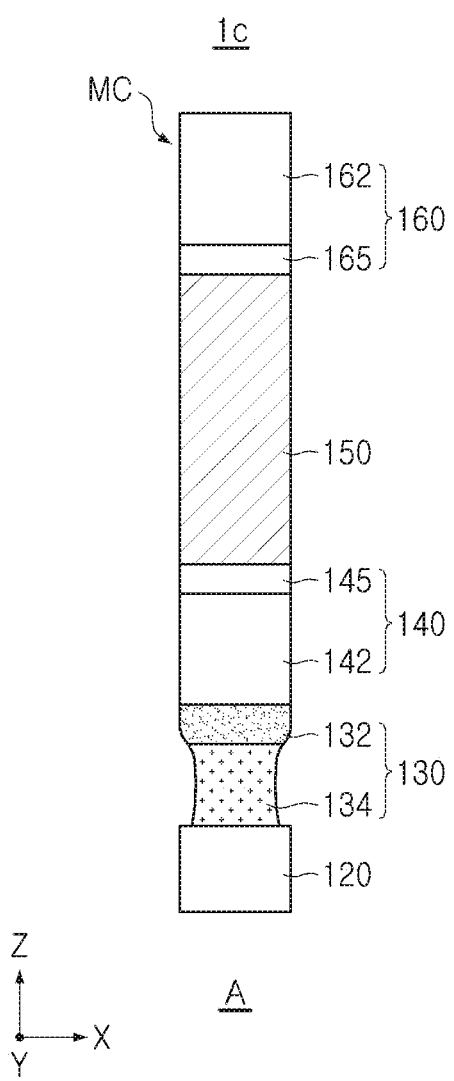

Referring to FIG. 9, in a semiconductor device 1c, a selector material pattern 130 may include concavely recessed side surfaces. A second selector material layer 134 may include concavely recessed side surfaces. Side surfaces of the first selector material layer 132 and the second selector material layer 134 may be connected to each other in a gentle curved line form.

Figure 10:
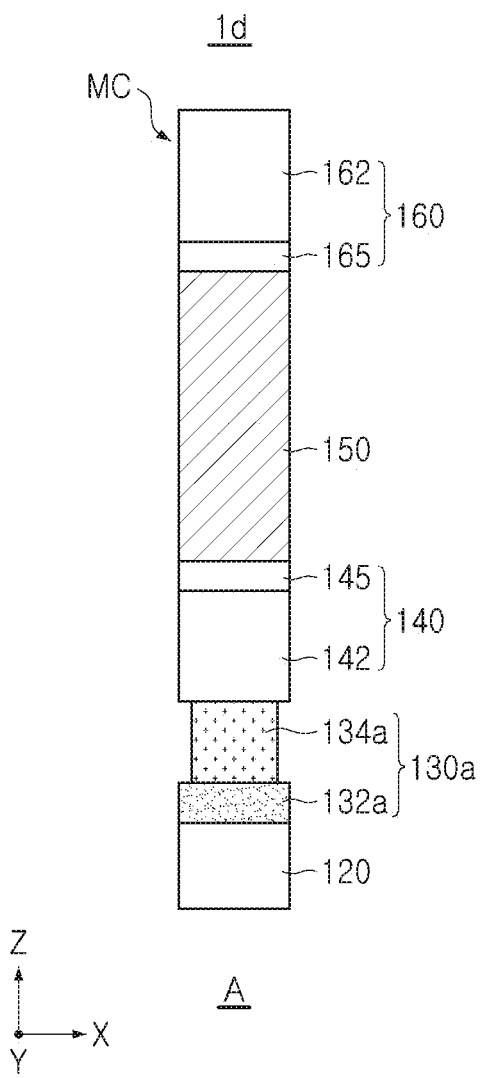

Referring to FIG. 10, in a semiconductor device 1d, a selector material pattern 130a may include a first selector material layer 132a and a second selector material layer 134a disposed on the first selector material layer 132a. The second selector material layer 134a may be disposed on a higher level than the first selector material layer 132a. The second selector material layer 134a may be disposed between the first selector material layer 132a and the intermediate electrode pattern 140. The second selector material layer 134a may be in contact with the intermediate electrode pattern 140. The first selector material layer 132a may be disposed on the lower electrode pattern 120. The first selector material layer 132a may be in contact with the lower electrode pattern 120. In an example embodiment, the selector material pattern 130 may have a vertically inverted 'T' shape.

The lower electrode pattern 120 may be in contact with the first selector material layer 132a of the selector material pattern 130. The intermediate electrode pattern 140 may be in contact with the second selector material layer 134a of the selector material pattern 130. The first intermediate electrode layer 142 may be in contact with the second selector material layer 134a.

In an example embodiment, the first selector material layer 132a may be disposed in a direction in which a current starts to flow in the selector material pattern 130, and the second selector material layer 134a may be disposed in a direction in which the current flows out from the selector material pattern 130. For example, in a case where the current flows from the lower electrode pattern 120 in contact with a lower surface of the selector material pattern 130 to the intermediate electrode pattern 140 in contact with an upper surface of the selector material pattern 130, the first selector material layer 132a may be disposed on the second selector material layer 134a.

The structures modified in the semiconductor devices 1a, 1b, 1c, and 1d of FIGS. 7 to 9 may be applied to the semiconductor device 2 of FIG. 6.

Figure 11:
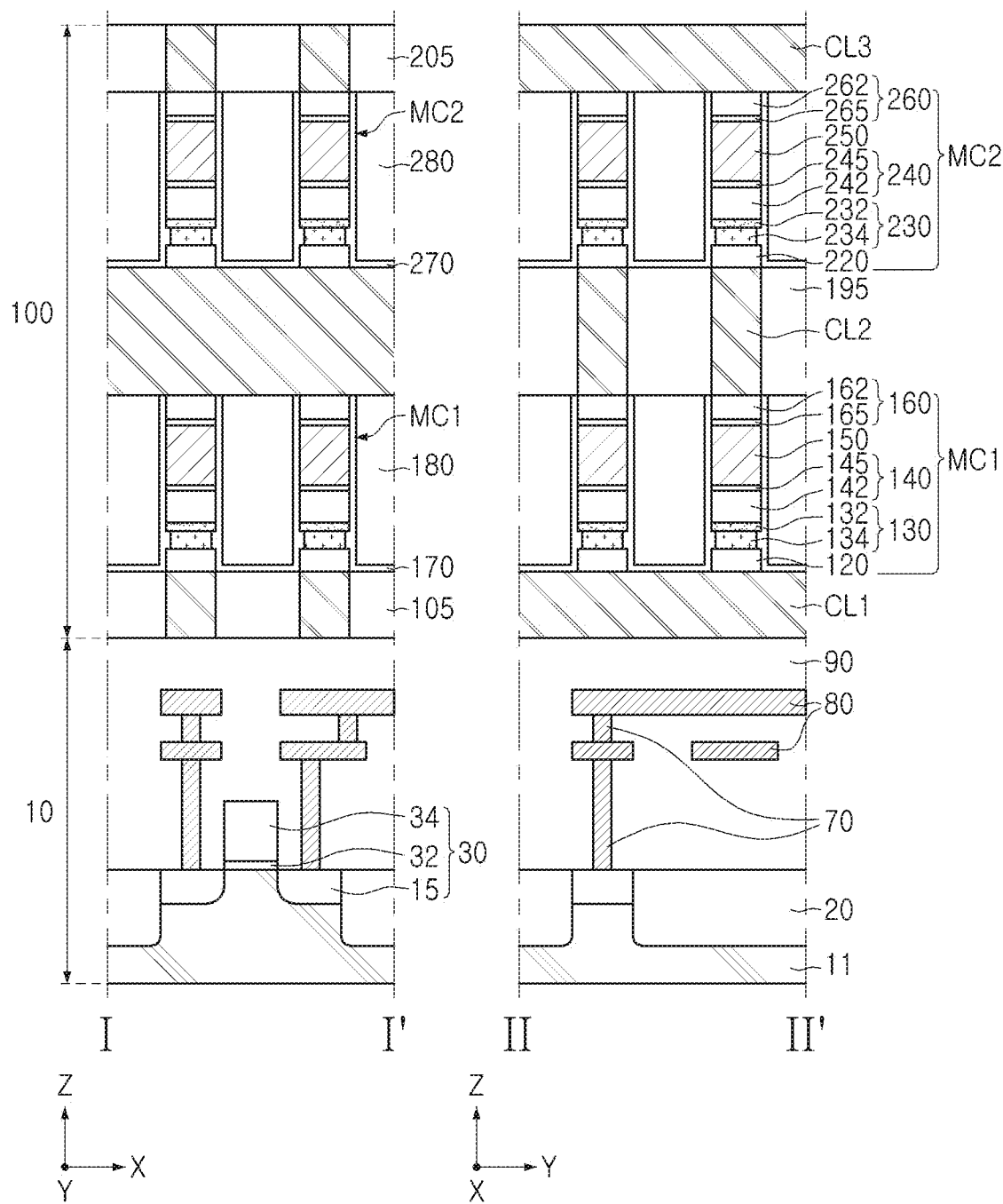
FIG. 11 is a schematic cross-sectional view of a semiconductor device according to example embodiments.

FIG. 11 is a schematic cross-sectional view of a semiconductor device according to example embodiments.

Referring to FIG. 11, in a semiconductor device 3, a cell stack structure 100 may be a two-stage structure including a first memory cell structure MC1 and a second memory cell structure MC2, and may include the first memory cell structure MC1, the second memory cell structure MC2, first to third conductive lines CL1, CL2, and CL3, first and second sidewall spacers 170 and 270, and first and second interlayer insulating layers 180 and 280.

The first conductive line CL1 may be disposed on the peripheral circuit region 10. The first conductive lines CL1 and the third conductive lines CL3 may extend in the second direction (for example, the Y direction) on the lower insulating structure 90, and may be disposed to be spaced apart from each other in the first direction (for example, the X direction) intersecting with the second direction (for example, the Y direction). The second conductive lines CL2 may extend in the first direction between the first and third conductive lines CL1 and CL3, and may be disposed to be spaced apart from each other in the second direction. The first memory cell structure MC1 may be disposed between the first conductive line CL1 and the second conductive line CL2, and similarly, the second memory cell structure MC2 may be disposed between the second conductive line CL2 and the third conductive line CL3.

In an example embodiment, one of the first conductive line CL1 and the second conductive line CL2 may be a word line, and the other of the first conductive line CL1 and the second conductive line CL2 may be a bit line. In a case where the second conductive line CL2 is the bit line, the third conductive line CL3 may be a word line.

Third gap-fill patterns 205 may be disposed between the third conductive lines CL3. For example, the third gap-fill patterns 205 may include at least one of SiN, SiON, SiC, SiCN, SiOC, SiOCN, $SiO_2$, and $Al_2O_3$. The third gap-fill patterns 205 may be formed by processes such as CVD, PVD, ALD, and SOG.

The first interlayer insulating layer 180 filling a space between the first memory cell structures MC1 may be disposed on the first gap-fill patterns 105 and the first conductive lines CL1. The second interlayer insulating layer 280 filling a space between the second memory cell structures MC2 may be disposed on the second gap-fill patterns 195 and the second conductive lines CL2. For example, the first and second interlayer insulating layers 180 and 280 may include at least one of SiN, SiON, SiC, SiCN, SiOC, SiOCN, $SiO_2$, and $Al_2O_3$. The first and second interlayer insulating layers 180 and 280 may be formed by processes such as CVD, PVD, ALD, and SOG.

In some example embodiments, at least one of the first to third gap-fill patterns 105, 195, and 205 and the first and second interlayer insulating layers 180 and 280 may have a multilayer structure including two or more layers having different compositions.

The first memory cell structure MC1 may include a first selector material pattern 130, a first information storage material pattern 150, and first electrode patterns 120, 140, and 160 connected to each other in series. The second memory cell structure MC2 may include a second selector material pattern 230, a second information storage material pattern 250, and second electrode patterns 220, 240, and 260 connected to each other in series. The second memory cell structure MC2 may be disposed above the first memory cell structure MC1. A disposition of each component of the second memory cell structure MC2 may be the same as that of the corresponding component of the first memory cell structure MC1.

The first and second selector material patterns 130 and 230 may include first selector material layers 132 and 232 and second selector material layers 134 and 234, respectively. The first and second electrode patterns may include lower electrode patterns 120 and 220, intermediate electrode patterns 140 and 240, and upper electrode patterns 160 and 260, respectively. The intermediate electrode patterns 140 and 240 of the first and second electrode patterns may include first intermediate electrode layers 142 and 242 and second intermediate electrode layers 145 and 245, respectively. The upper electrode patterns 160 and 260 of the first and second electrode patterns may include first upper electrode layers 165 and 265 and second upper electrode layers 162 and 265, respectively.

The first selector material layer 132 of the first selector material pattern 130 may be disposed on the second selector material layer 134 of the first selector material pattern 130. The first selector material layer 232 of the second selector material pattern 230 may be disposed on the second selector material layer 234 of the first selector material pattern 230.

Components of the first memory cell structure MC1 and the second memory cell structure MC2 may be understood with reference to the description for the same or similar components of the memory cell structure MC of the semiconductor device 1 described with reference to FIGS. 1 to 3.

The first and second sidewall spacers 170 and 270 may be disposed on side surfaces of the first and second memory cell structures MC1 and MC2, respectively.

Components according to the present example embodiment may be understood with reference to the description for the same or similar components of the semiconductor device 1 illustrated in FIGS. 1 to 3 unless explicitly described otherwise.

Figure 12:
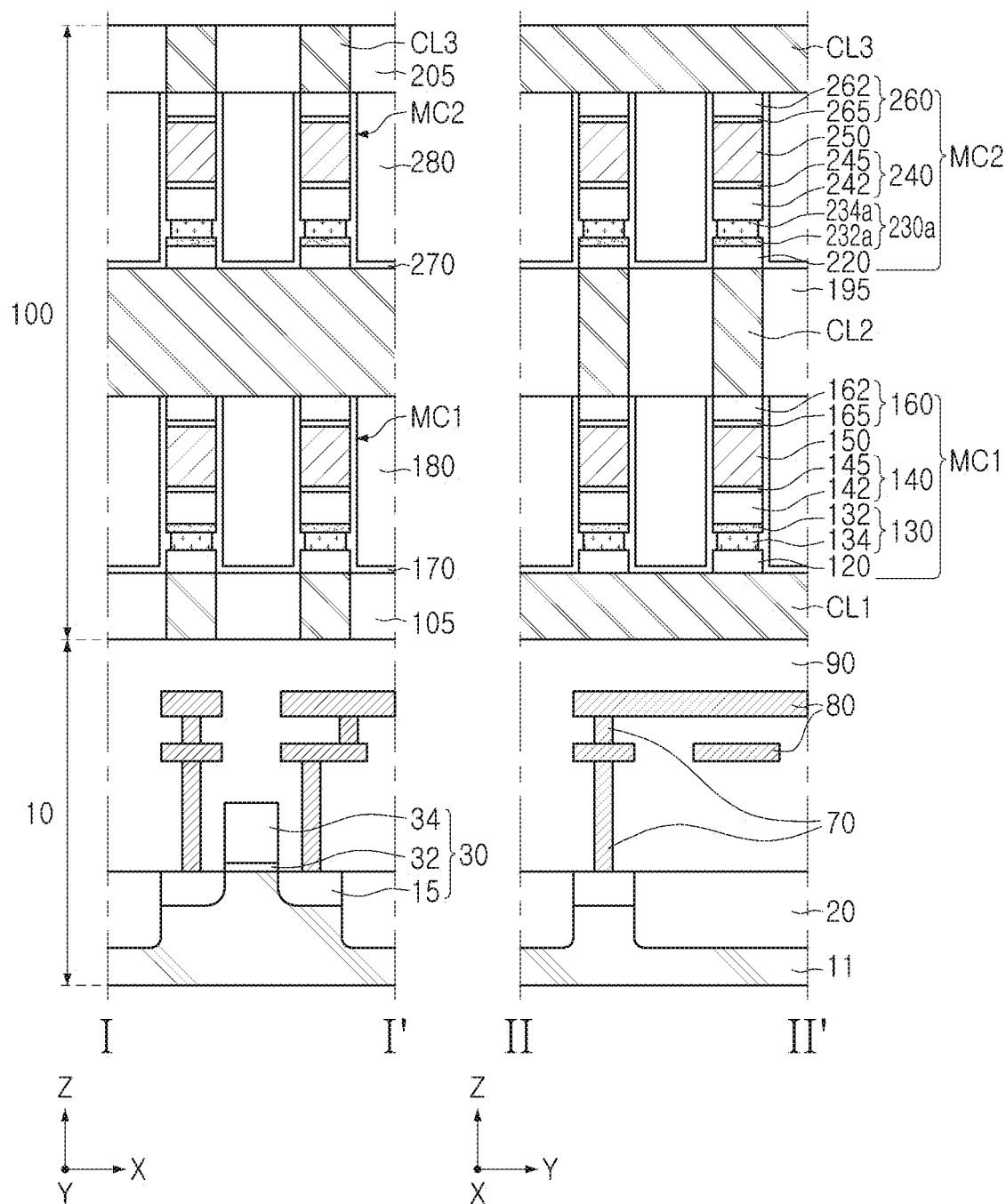
FIG. 12 is a schematic cross-sectional view of a semiconductor device according to example embodiments.

FIG. 12 is a schematic cross-sectional view of a semiconductor device according to example embodiments.

Referring to FIG. 12, in a semiconductor device 4, a second memory cell structure MC2 may be different in a disposition relation between corresponding components from a first memory cell structure MC1, unlike the semiconductor device 3 of FIG. 10.

A first selector material pattern 130 may include a second selector material layer 134 disposed on the lower electrode pattern 120 of the first memory cell structure MC1 and a first selector material layer 132 disposed on the second selector material layer 134.

A second selector material pattern 230a may include a first selector material layer 232a disposed on the lower electrode pattern 220 of the second memory cell structure MC2 and a second selector material layer 234a disposed on the first selector material layer 232a. That is, the first selector material layer 232a of the second selector material pattern 230a may be disposed on a level below the second selector material layer 234a of the second selector material pattern 230a. A width of the first selector material layer 232a of the second selector material pattern 230a in the first direction (for example, the X direction) may be greater than that of the second selector material layer 234a of the second selector material pattern 230a.

In an example embodiment, the first and second selector material patterns 130 and 230a may be symmetrical with respect to a central axis between both side surfaces of each of the first and second selector material patterns 130 and 230a. In an example embodiment, the first selector material pattern 130 may have a 'T' shape. In an example embodiment, the second selector material pattern 230a may have a vertically inverted 'T' shape.

In an example embodiment, the first selector material layers 132 and 232a of the first and second selector material patterns 130 and 230a may be disposed in directions in which a current starts to flow in the first and second selector material patterns 130 and 230a, respectively, and the second selector material layers 134 and 234a of the first and second selector material patterns 130 and 230a may be disposed in directions in which the current flows out from the first and second selector material patterns 130 and 230a, respectively. For example, in a case where the current flows from a first intermediate electrode pattern 140 in contact with an upper surface of the first selector material pattern 130 to a first lower electrode pattern 120 in contact with a lower surface of the first selector material pattern 130, the first selector material layer 132 of the first selector material pattern 130 may be disposed on the second selector material layer 134 of the first selector material pattern 130. For example, in a case where the current flows from a second lower electrode pattern 220 in contact with a lower surface of the second selector material pattern 230a to a second intermediate electrode pattern 240 in contact with an upper surface of the second selector material pattern 230a, the first selector material layer 232a of the second selector material pattern 230a may be disposed beneath the second selector material layer 234a of the second selector material pattern 230a.

Figure 13:
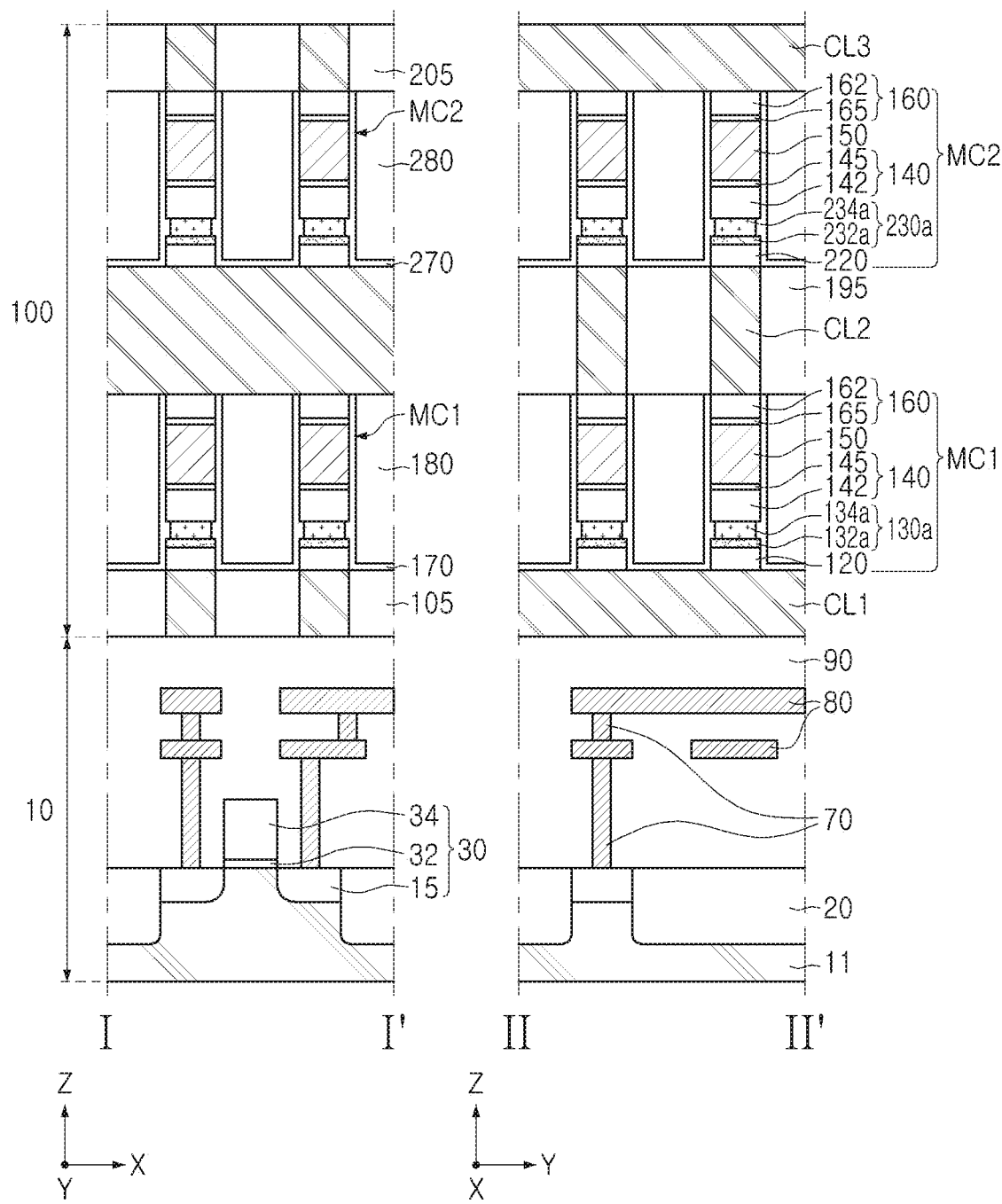
FIG. 13 is a schematic cross-sectional view of a semiconductor device according to example embodiments.

FIG. 13 is a schematic cross-sectional view of a semiconductor device according to example embodiments.

Referring to FIG. 13, in a semiconductor device 5, dispositions of components of a first memory cell structure MC1 and a second memory cell structure MC2 may be the same as each other.

A first selector material pattern 130a of the first memory cell structure MC1 may include a first selector material layer 132a disposed on the lower electrode pattern 120 of the first memory cell structure MC1 and a second selector material layer 134a disposed on the first selector material layer 132a. That is, the first selector material layer 132a of the first selector material pattern 130a may be disposed beneath the second selector material layer 134a of the first selector material pattern 130a.

A second selector material pattern 230a of the second memory cell structure MC2 may include a first selector material layer 232a disposed on the lower electrode pattern 220 of the second memory cell structure MC2 and a second selector material layer 234a disposed on the first selector material layer 232a. That is, the second selector material layer 232a of the second selector material pattern 230a may be disposed beneath the second selector material layer 234a of the second selector material pattern 230a.

The description for the memory cell structure MC described in FIGS. 2 to 9 may be applied to the first and second memory cell structures MC1 and MC2 according to the present example embodiments.

FIGS. 14A to 14D are schematic views illustrating a method of manufacturing a semiconductor device according to example embodiments. FIGS. 14A to 14D are cross-sectional views illustrating a region taken along line I-I' and a region taken along line II-II' of FIG. 1.

Figure 14A:
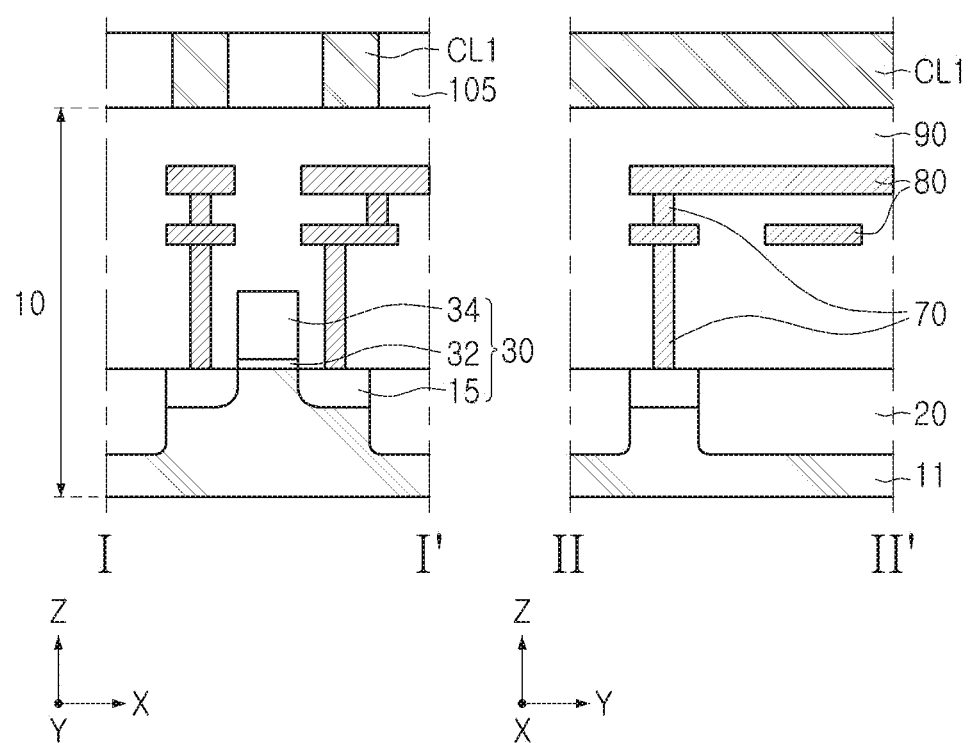
FIGS. 14A to 14D are schematic views illustrating a method of manufacturing a semiconductor device according to example embodiments.

Referring to FIG. 14A, the peripheral circuit region 10 may be formed. The forming of the peripheral circuit region 10 may include forming the device isolation layer 20 on the semiconductor substrate 11, the device isolation layer 20 defining the active region; forming the peripheral device 30 on the active region, the peripheral device 30 including the gate dielectric layer 32, the circuit gate electrode 34, and the source/drain regions 15; forming the wiring structures 70 and 80 on the peripheral devices 30; and forming the lower insulating structure 90 covering the wiring structures 70 and 80 and the peripheral device 30.

The first conductive lines CL1 and the first gap-fill patterns 105 may be formed on the peripheral circuit region 10. The first conductive line CL1 may include a conductive material such as tungsten. The first gap-fill patterns 105 may be formed on side surfaces of the first conductive line CL1.

Figure 14B:
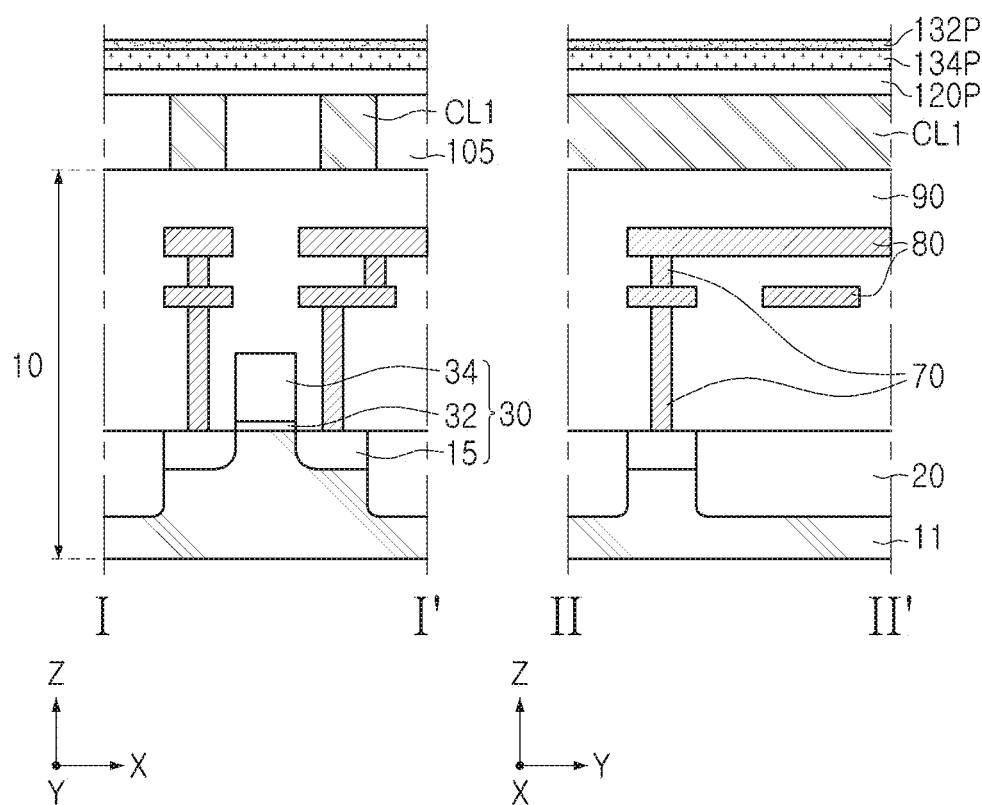

Referring to FIG. 14B, a preliminary lower electrode pattern 120P, a preliminary second selector material layer 134P, and a preliminary first selector material layer 132P that are sequentially stacked on the first conductive lines CL1 and the first gap-fill patterns 105 may be formed.

In an example embodiment, the preliminary first selector material layer 132P may include a first material having relatively low threshold voltage drift, and the preliminary second selector material layer 134P may include a second material having a threshold voltage drift higher than that of the first material.

In an example embodiment, the preliminary first selector material layer 132P may include a material having a first leakage current, and the preliminary second selector material layer 134P may include a material having a second leakage current smaller than the first leakage current.

In an example embodiment, a thickness of the preliminary second selector material layer 134P may be substantially the same as that of the preliminary first selector material layer 132P. In another example embodiment, a thickness of the preliminary second selector material layer 134P may be greater than that of the preliminary first selector material layer 132P.

Figure 14C:
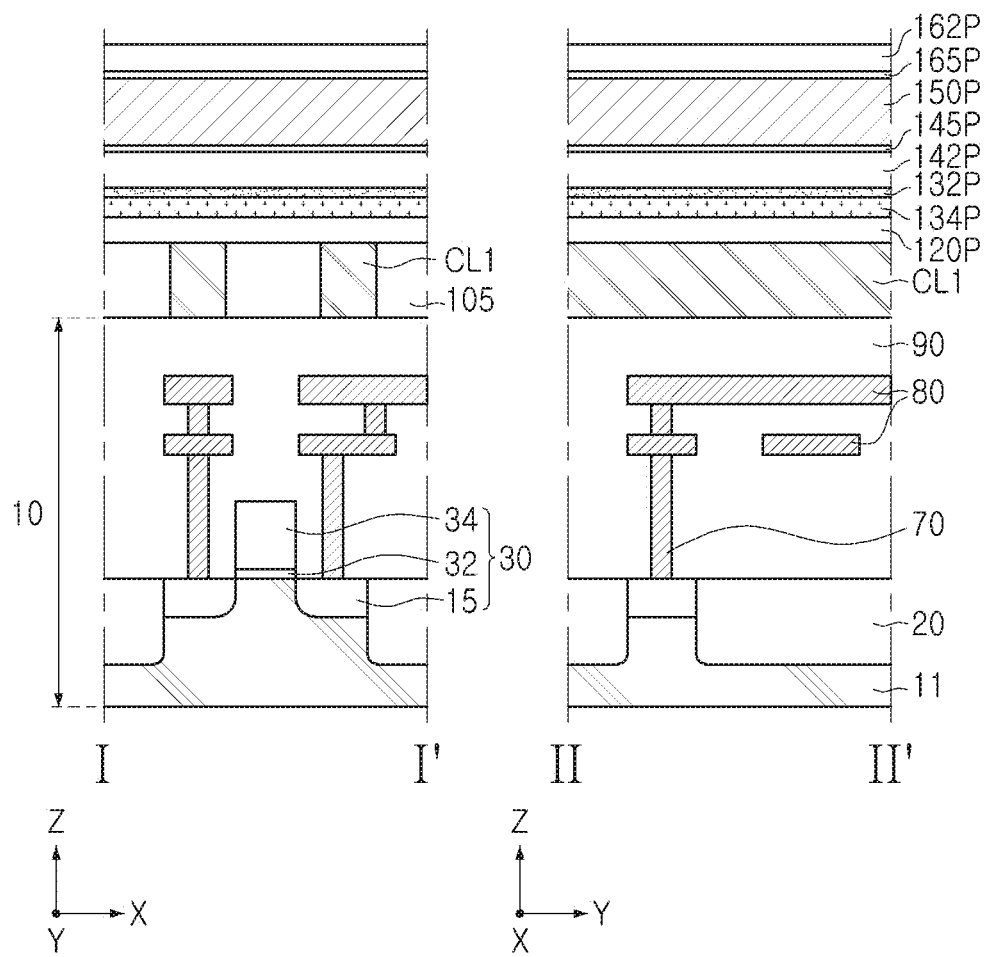

Referring to FIG. 14C, a preliminary first intermediate electrode layer 142P, a preliminary second intermediate electrode layer 145P, a preliminary information storage material pattern 150P, a preliminary first upper electrode layer 165P, and a preliminary second upper electrode layer 162P that are sequentially stacked on the preliminary first selector material layer 132P may be formed.

Figure 14D:
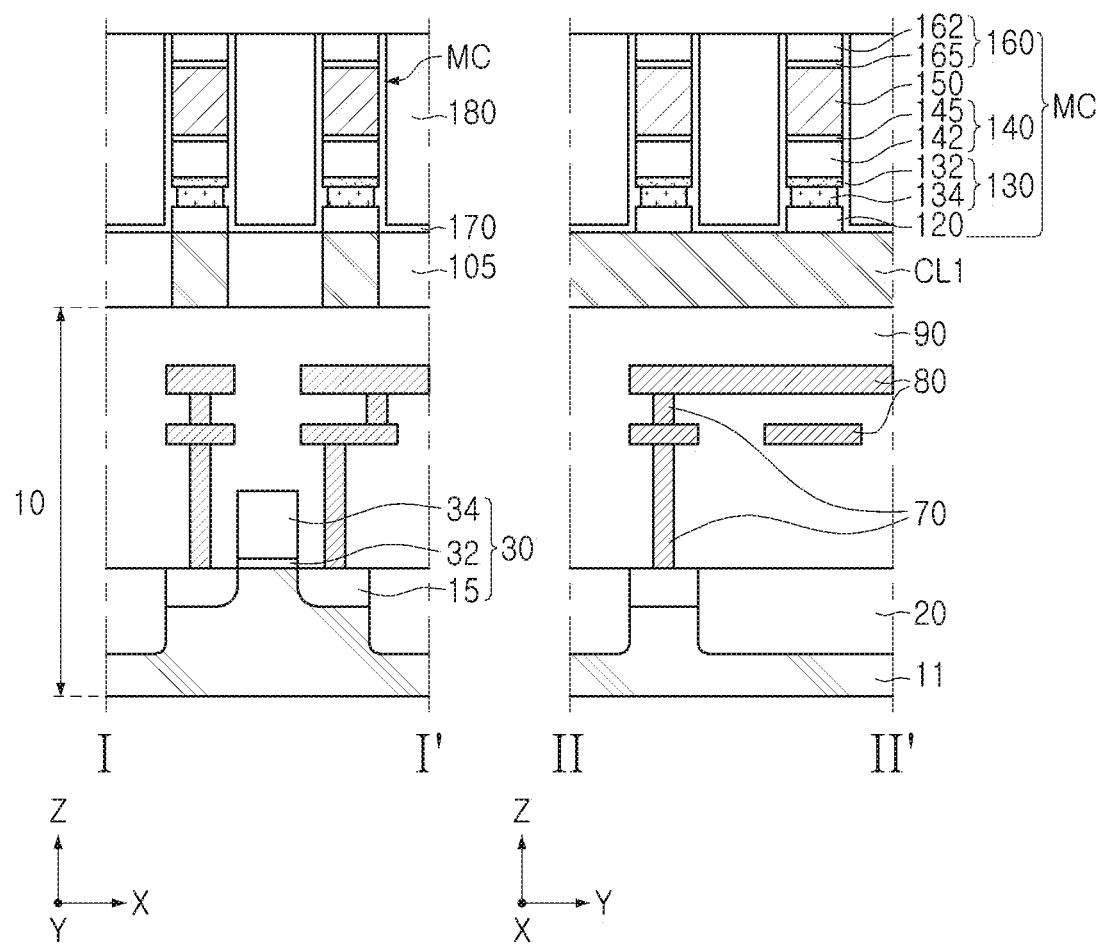

Referring to FIG. 14D, the lower electrode pattern 120, the selector material pattern 130, the intermediate electrode pattern 140, the information storage material pattern 150, and the upper electrode pattern 160 that are sequentially stacked may be formed by patterning the preliminary lower electrode pattern 120P, the preliminary second selector material layer 134P, the preliminary first selector material layer 132P, the preliminary first intermediate electrode layer 142P, the preliminary second intermediate electrode layer 145P, the preliminary information storage material pattern 150P, the preliminary first upper electrode layer 165P, and the preliminary second upper electrode layer 162P. The lower electrode pattern 120, the selector material pattern 130, the intermediate electrode pattern 140, the information storage material pattern 150, and the upper electrode pattern 160 that are sequentially stacked may be the memory cell structure MC as described in FIGS. 1 to 3. The sidewall spacers 170 and the interlayer insulating layer 180 that surround the side surfaces of the memory cell structure MC may be formed.

In an example embodiment, in a case of patterning the preliminary first selector material layer 132P and the preliminary second selector material layer 134P, the preliminary first selector material layer 132P and the preliminary second selector material layer 134P may be patterned by dry etching and may then be additionally etched using wet etching or dry etching. In an example embodiment, in the case of patterning the preliminary first selector material layer 132P and the preliminary second selector material layer 134P, the second selector material layer 134 may be formed to have a width narrower than that of the first selector material layer 132.

Again, referring to FIG. 2, the second conductive lines CL2 and the second gap-fill patterns 195 may be formed on the sidewall spacers 170 and the interlayer insulating layer 180 of the memory cell structure MC.

Figure 15:
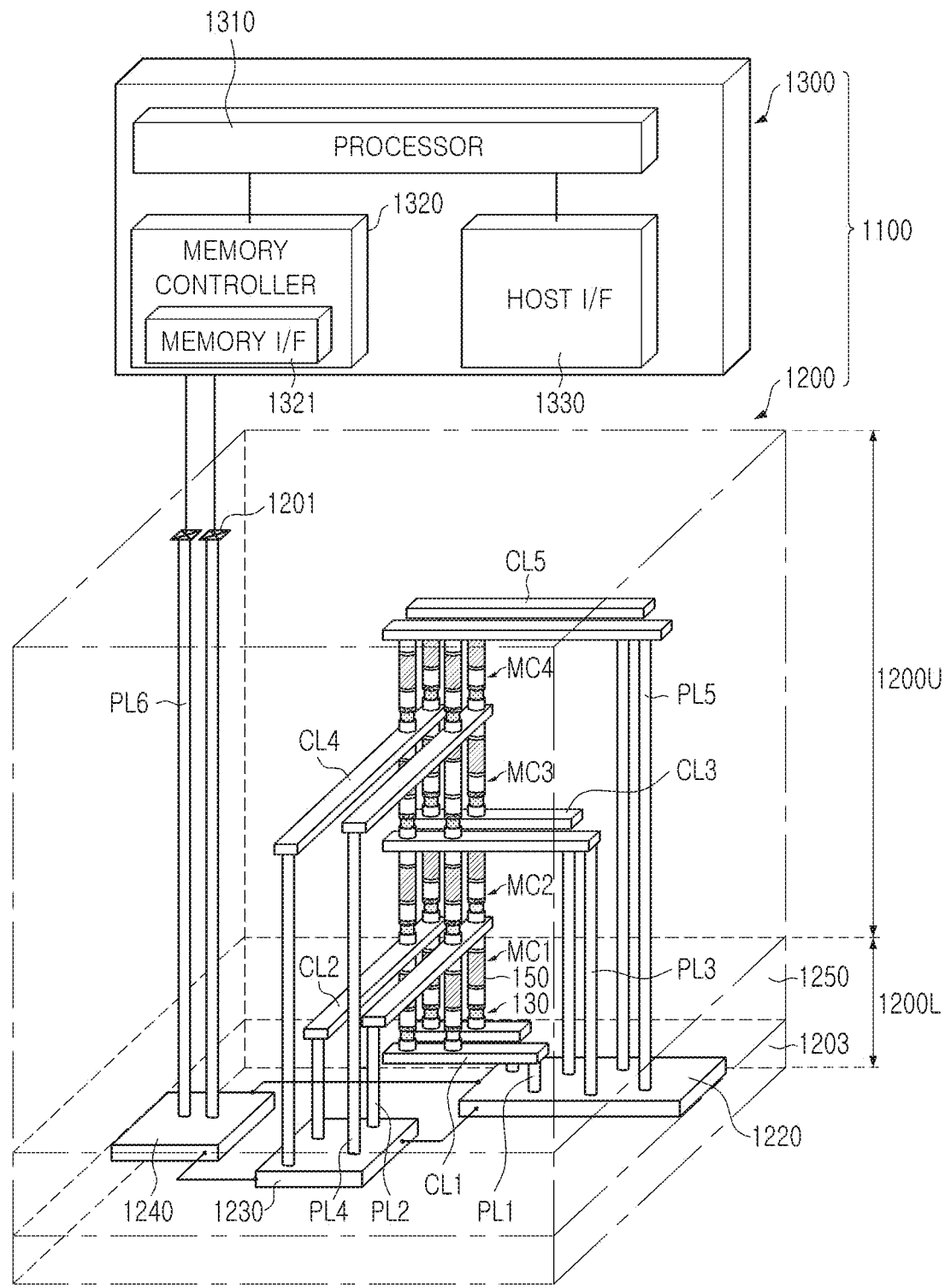
FIG. 15 is a schematic view illustrating an electronic system including a semiconductor device according to an example embodiment.

FIG. 15 is a schematic view illustrating an electronic system including a semiconductor device according to an example embodiment.

Referring to FIG. 15, an electronic system 1100 according to an example embodiment of the present disclosure may include a semiconductor device 1200 and a controller 1300 electrically connected to the semiconductor device 1200. The electronic system 1100 may be a storage device including the semiconductor device 1200 or an electronic device including the storage device. For example, the electronic system 1100 may be a solid state drive (SSD) device, a universal serial bus (USB), a computing system, a medical device, or a communication device including the semiconductor device 1200.

The semiconductor device 1200 may be the semiconductor device according to any one of example embodiments described above with reference to FIGS. 1 to 12. The semiconductor device 1200 may include a first structure 1200L and a second structure 1200U on the first structure 1200L.

The first structure 1200L may include a row driver 1220, a column driver 1230, and a control logic 1240 electrically connected to the column driver 1230. The row driver 1220 may include an address decoder circuit for selecting information storage material patterns (for example, 150 in FIG. 2) of memory cell structures (for example, MC of FIG. 1) to which data are to be recorded or from which data are to be read, and the column driver 1230 may include a read/write circuit writing data to the information storage material patterns (for example, 150 in FIG. 2) of the memory cell structures (for example, MC of FIG. 1) or reading data from the information storage material patterns 150. Operations of the row driver 1220 and the column driver 1230 may be controlled by the control logic 1240. The first structure 1200L may include the peripheral circuit region (10 of FIG. 2) described with reference to FIGS. 1 to 3.

The second structure 1200U may include a plurality of memory cell structures stacked in a vertical direction.

In an example, the plurality of memory cell structures may include two memory cell structures MC1 and MC2 as illustrated in FIGS. 10 to 12.

In an example, the plurality of memory cell structures may include two or more memory cell structures. For example, the plurality of memory cell structures may include first to fourth memory cell structures MC1, MC2, MC3, and MC4 stacked in the vertical direction. Each of the first to fourth memory cell structures MC1, MC2, MC3, and MC4 may include the information storage material pattern 150 and the selector material pattern 130 as illustrated in FIG. 2. In another example, each of the first to fourth memory cell structures MC1, MC2, MC3, and MC4 may include the information storage material pattern and the selector material pattern according to various examples described with reference to FIGS. 1 to 12.

An example embodiment of the present disclosure may have a structure in which memory cell structures more than four memory cell structures are vertically stacked.

The second structure 1200U may further include first conductive lines CL1 disposed between the first memory cell structure MC1 and the first structure 1200L and extending in a first horizontal direction, second conductive lines CL2 extending in a second horizontal direction between the first memory cell structure MC1 and the second memory cell structure MC2, third conductive lines CL3 extending in the first horizontal direction between the second memory cell structure MC2 and the third memory cell structure MC3, fourth conductive lines CL2 extending in the second horizontal direction between the third memory cell structure MC3 and the fourth memory cell structure MC4, and fifth conductive lines CL5 extending in the first horizontal direction on the fourth memory cell structure MC4.

In an example, the first, third, and fifth conductive lines CL1, CL3, and CL5 may be word lines, and the second and fourth conductive lines CL2 and CL4 may be bit lines.

The second structure 1200U may further include first, third, and fifth contact structures PL1, PL3, and PL5 electrically connecting the first, third, and fifth conductive lines CL1, CL3, and CL5 to the row decoder 1220, respectively, and second and fourth contact structures PL2 and PL4 electrically connecting the second and fourth conductive lines CL2 and CL4 to the column decoder 1230, respectively.

The second structure 1200U may include input/output pads 1201. The semiconductor device 1200 may further include input/output contact structures PL6 electrically connected to the input/output pads 1201, penetrating through the second structure 1200U, extending into the first structure 1200L, and electrically connected to the control logic 1240.

The semiconductor device 1200 may communicate with the controller 1300 through an input/output pads 1201 electrically connected to the control logic 1240. The controller 1300 may include a processor 1310, a memory controller 1322, and a host interface 1330. According to example embodiments, the electronic system 1100 may include a plurality of semiconductor devices 1200, and in this case, the controller 1300 may control the plurality of semiconductor devices 1200.

The processor 1310 may control a general operation of the electronic system 1100 including the controller 1300. The processor 1310 may operate according to desired and/or alternatively predetermined firmware, and may access the semiconductor device 1200 by controlling the memory controller 1320. The memory controller 1320 may include a memory interface 1321 processing communication with the semiconductor device 1200.

A control command for controlling the semiconductor device 1200, data to be written to the information storage material patterns 150 of the memory cell structures MC1, MC2, MC3, and MC4 of the semiconductor device 1200, data to be read from the information storage material patterns 150 of the memory cell structures MC1, MC2, MC3, and MC4 of the semiconductor device 1200, and the like, may be transmitted through the memory interface 1321. The host interface 1330 may provide a communication function between the electronic system 1100 and an external host. When a control command is received from the external host through the host interface 1330, the processor 1310 may control the semiconductor device 1200 in response to the control command.

One or more of the elements (e.g., controller 1300 and/or parts therein, control logic 1240) in FIG. 15 may include or may be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

According to example embodiments, both leakage current and threshold voltage change characteristics may be improved by forming the selector material pattern in a multilayer structure including two or more layers.

While example embodiments have been illustrated and described above, it will be apparent to those skilled in the art that modifications and variations could be made without departing from the scope of the present inventive concept as defined by the appended claims.

What is claimed is:
1. A semiconductor device comprising:
a semiconductor substrate;
a peripheral device on the semiconductor substrate;

a lower insulating structure on the semiconductor substrate and covering the peripheral device;
a first conductive line on the lower insulating structure;
a memory cell structure on the first conductive line,
the memory cell structure including an information storage material pattern and a selector material pattern on the lower insulating structure in a vertical direction,
the selector material pattern including a first selector material layer having a first width and a second selector material layer having a second width narrower than the first width, the first selector material layer including a first material, the second selector material layer including a second material, and a threshold voltage drift of the second material being higher than a threshold voltage drift of the first material; and
a second conductive line on the memory cell structure.

2. The semiconductor device of claim 1, wherein the selector material pattern is symmetrical with respect to a central axis between both side surfaces of the selector material pattern.

3. The semiconductor device of claim 1, wherein
the first selector material layer has a first thickness in the vertical direction, and
the second selector material layer has a second thickness greater than the first thickness in the vertical direction.

4. The semiconductor device of claim 1, wherein the first selector material layer and the second selector material layer have substantially a same thickness.

5. The semiconductor device of claim 1, wherein the first selector material layer is on the second selector material layer.

6. The semiconductor device of claim 1, wherein the second selector material layer is on the first selector material layer.

7. The semiconductor device of claim 1, wherein
the memory cell structure further includes electrode patterns, and
the electrode patterns include a lower electrode pattern below the selector material pattern, an intermediate electrode pattern between the selector material pattern and the information storage material pattern, and an upper electrode pattern above the information storage material pattern.

8. The semiconductor device of claim 7, wherein
the first selector material layer is on the second selector material layer,
the first selector material layer is in contact with the intermediate electrode pattern, and
the second selector material layer is in contact with the lower electrode pattern.

9. The semiconductor device of claim 1, wherein
the memory cell structure further includes electrode patterns, and
the electrode patterns include a lower electrode pattern below the information storage material pattern, an intermediate electrode pattern between the selector material pattern and the information storage material pattern, and an upper electrode pattern above the selector material pattern.

10. The semiconductor device of claim 9, wherein
the first selector material layer is on the second selector material layer,
the first selector material layer is in contact with the upper electrode pattern, and
the second selector material layer is in contact with the intermediate electrode pattern.

11. The semiconductor device of claim 1, wherein
the first conductive line is a word line, and
the second conductive line is a bit line.

12. The semiconductor device of claim 1, wherein
a leakage current value of the second material of the second selector material layer is smaller than a leakage current value of the first material of the first selector material layer.

13. A semiconductor device comprising:
a first conductive line on a semiconductor substrate;
a second conductive line on the first conductive line;
a third conductive line on the second conductive line; and
a plurality of memory cell structures on the semiconductor substrate,
the plurality of memory cell structures including a first memory cell structure and a second memory cell structure,
the first memory cell structure being between the first conductive line and the second conductive line,
the first memory cell structure including a first selector material pattern, a first information storage material pattern, and first electrode patterns overlapping each other in a vertical direction,
the second memory cell structure being between the second conductive line and the third conductive line,
the second memory cell structure including a second selector material pattern, a second information storage material pattern, and second electrode patterns overlapping each other in the vertical direction, and
each of the first selector material pattern and the second selector material patterns including a first selector material layer having a first width and a second selector material layer having a second width narrower than the first width.

14. The semiconductor device of claim 13, wherein the first selector material pattern and the second selector material pattern are symmetrical with respect to a central axis between both side surfaces of each of the first selector material pattern and the second selector material pattern.

15. The semiconductor device of claim 13, wherein
the first selector material layer has a first thickness in the vertical direction,
the second selector material layer has a second thickness in the vertical direction, and
the second thickness is greater than the first thickness.

16. The semiconductor device of claim 13, wherein
the first selector material layer of the first selector material pattern is above the second selector material layer of the first selector material pattern, and
the first selector material layer of the second selector material pattern is below the second selector material layer of the second selector material pattern.

17. The semiconductor device of claim 13, wherein
the first selector material layer of the first selector material pattern is above the second selector material layer of the first selector material pattern, and
the first selector material layer of the second selector material pattern is above the second selector material layer of the second selector material pattern.

18. The semiconductor device of claim 13, wherein
the first selector material layer of the first selector material pattern is below the second selector material layer of the first selector material pattern, and
the first selector material layer of the second selector material pattern is below the second selector material layer of the second selector material pattern.

19. A semiconductor device comprising:
a first conductive line;
a second conductive line above the first conductive line; and
a memory cell structure between the first conductive line and the second conductive line,
the memory cell structure including an information storage material pattern and a selector material pattern connected to each other in series in a vertical direction,
the selector material pattern including a first selector material layer directly contacting a second selector material layer, the first selector material layer having a first thickness and the second selector material layer having a second thickness,
the first selector material layer including a first material, and the second selector material layer including a second material having a threshold voltage drift higher than a threshold voltage drift of the first material.

20. The semiconductor device of claim 19, wherein a width of the second selector material layer is narrower than a width of the first selector material layer.

\* \* \* \* \*